United States Patent [19]

Oliver, Jr.

[11] Patent Number: 4,849,723
[45] Date of Patent: Jul. 18, 1989

[54] WAVEGUIDE FILTER

[76] Inventor: Harry S. Oliver, Jr., 2701 Pfefferkorn Rd., West Friendship, Md. 21794

[21] Appl. No.: 198,565

[22] Filed: May 25, 1988

[51] Int. Cl.$^4$ .................. H01P 1/20; H01P 1/209; H01P 1/207
[52] U.S. Cl. ............................... 333/208; 333/12; 333/202; 333/248; 350/96.15; 350/96.1
[58] Field of Search .............. 333/202, 208, 209, 182, 333/12, 210, 211, 212, 206, 207, 248; 350/96.1, 96.15, 96.2, 96.23

[56] References Cited

U.S. PATENT DOCUMENTS 2,322,971 6/1943 Roosenstein .......................... 333/12
3,611,214 10/1971 Gerlack .......................... 333/212 X Primary Examiner—Marvin L. Nussbaum
Attorney, Agent, or Firm—Morton J. Rosenberg

[57] ABSTRACT

A waveguide filter (100) is provided for functioning as a cable feed-through for previously terminated cables (50). Waveguide filter feed-through (100) includes a housing (110) of predetermined length having a plurality of bores (130, 140) extending therethrough. One of the bores (140) being centrally located, with each of the other bores (130) being located radially about the central bore (140). Each of the radially located bores (130) form an individual waveguide when a plug (120) is inserted within the central bore (140). Each of the waveguide passages (130) include a longitudinal passage extending the full length of housing (110) and opening into the central bore (140). This permits the terminated ends (58) from each of a pair of fiber optic cables (55) to pass through the central bore (140) followed by the duplex fiber optic cable portion (50), containing the pair of fiber optic cables (55), to be inserted into waveguide passage (130) through the longitudinal access opening between passages (130 and 140). The longitudinal access opening is subsequently closed by plug (120) which is then releasably fastened to the housing (110).

21 Claims, 1 Drawing Sheet

WAVEGUIDE FILTER

BACKGROUND OF THE INVENTION

1. Field of the Invention

This invention directs itself to waveguide filters for providing cable access to a shielded enclosure. In particular, this invention directs itself to a waveguide filter feed-through for cables previously terminated, and where high frequency attenuation of electromagnetic radiation is required. Still further, this invention directs itself to waveguide filter feed-through devices having a housing in which at least two overlapping passages are formed therethrough, with a longitudinal access opening formed between the two passages. One of the passages, having a smaller diameter, forms a waveguide passage, the other forming a passage through which the terminated ends of cables can pass and into which a plug is inserted to form a closure for the longitudinal access opening between the two passages.

2. Prior Art

Waveguide filters for use as cable feed-throughs are well-known in the art. The best prior art known to the Applicant includes U.S. Pat. Nos. 3,385,970; 4,358,632; 3,587,009; 4,109,222; 4,267,401; 3,851,282; 3,779,585; 3,489,440; 3,534,146; 4,255,616; 4,249,353; 3,092,360; and, 4,693,767.

Some prior art systems such as shown in U.S. Pat. No. 3,385,970 are directed to waveguides operating below cut-off for providing an optical coupling link through a shielded enclosure. The diameter of the central bore and the length of the waveguide are predetermined to achieve the desired attenuation and cut-off frequency. However, when previously terminated cables are used, the bore diameter is no longer determined by the desired cut-off frequency and attenuation, but is mandated by the size of the terminated connector. To compensate somewhat for the increased diameter of the bore, the length of the waveguide must be increased, which in some applications may not be practical due to space limitations. Even with increased length, prior art waveguide filters having bore diameters sufficiently large to accommodate previously terminated cables exhibit lower performance, with respect to high frequency attenuation, than the smaller bore diameter waveguide filter for use with terminated cables.

Thus, as shown in FIG. 1, the prior art waveguide filter feed-through 10 comprises a housing 20 in which is formed one or more waveguide passages 30 extending longitudinally through housing 20. Each of the waveguide passages 30 has a diameter larger than the diameter of the optical cable termination 58 which passes therethrough.

Since the diameter of the waveguide passage 30 greatly affects the cut-off frequency for the device, this diameter is kept as close to the diameter for connector termination 58 as practical. Therefore, only one fiber optic cable 55 can access an individual waveguide passage 30. Thus, a duplex fiber optic cable 50 must be split apart exposing the two individual optical cables 55 and passing each through separate waveguide passages 30, as shown in FIG. 1. In contra distinction, the instant invention provides the means for inserting the previously terminated duplex fiber optic cable 50 through a single waveguide passage, the waveguide passage having a smaller diameter than that required by the prior art, thus providing improved performance, with respect to cut-off frequency and attenuation.

The housing 20 of the prior art device shown in FIG. 1 is provided with threads 15 for coupling to a shielded enclosure with a pair of internally threaded fasteners 90. The instant invention is similarly provided with this method of fastening to a shielded enclosure so as to be interchangeable therewith.

In other prior art systems such as U.S. Pat. No. 4,358,632, there are provided electrically shielded cable entrances for passing cables through a bulkhead. However, these systems are comprised of members split into interfitting halves made from an electrically conductive elastic material which are forced in compressive contact with the cables passing therethrough. These structures provide an electrical grounding type shield, and do not form a waveguide filter.

SUMMARY OF THE INVENTION

A waveguide filter for functioning as a cable feed-through of previously terminated cables is provided. The waveguide filter has predetermined dimensions for attenuating electromagnetic radiation of predetermined bandwidth, and includes a longitudinally extended housing having at least two overlapping longitudinally directed bores extending therethrough. The first of the two bores forms a waveguide filter and includes a common longitudinal access opening with the second of the two bores. A plug member insertable within the second bore forms a closure for the waveguide access opening between the two bores, the plug member being releasably fastened to the housing.

DESCRIPTION OF THE PREFERRED EMBODIMENTS

Figure 2:
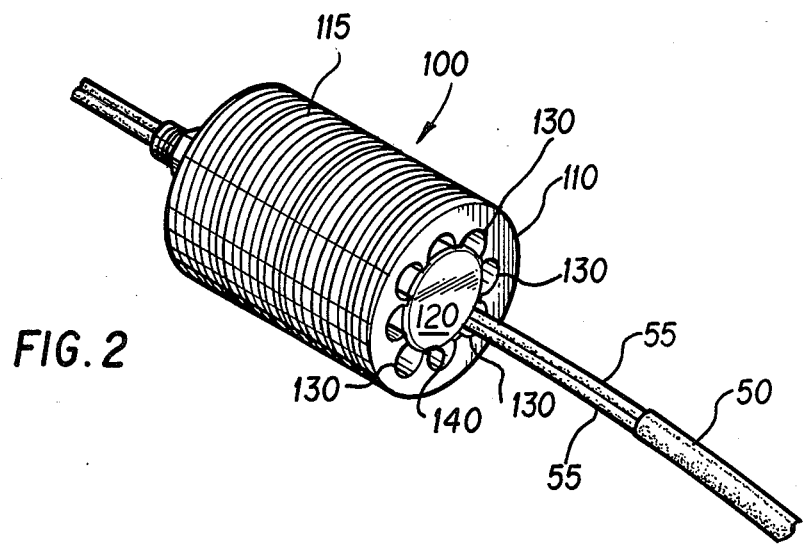
FIG. 2 is a perspective view of the waveguide filter feed-through embodying the inventive concept; and, FIG. 3 is a cut-away exploded plane view of the embodiment of FIG. 2.
Figure 3:
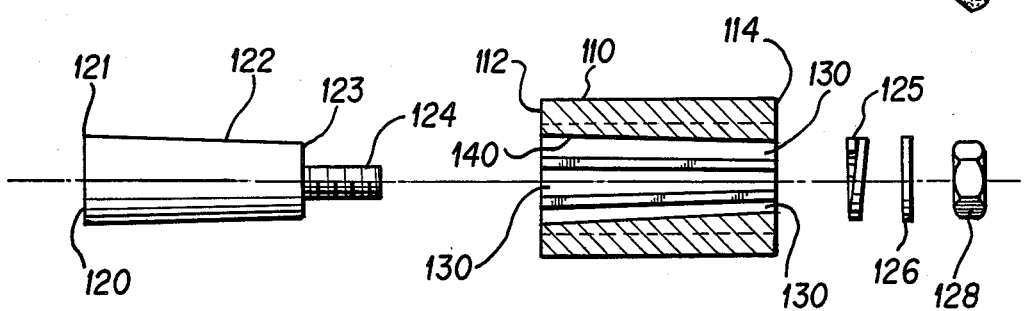

Referring now to FIGS. 2 and 3, there is shown waveguide filter feed-through 100 for providing a cable access to a shielded enclosure while providing a predetermined frequency vs. attenuation characteristic. As will be seen in following paragraphs, waveguide filter 100 is specifically directed to the concept of providing a cable feed-through for previously terminated cables while maintaining a filter characteristic of high attenuation for high frequency electromagnetic radiation. Though not restricted to applicatior's for providing access to shielded enclosures by optical cables, waveguide filter feed-through 100 is particularly advantageous in providing access to previously terminated duplex fiber optic cables 50. Waveguide filter feed-through 100 provides the means for inserting the previously terminated duplex fiber optic cable 50 into the shielded enclosure without significantly separating each of the fiber optic cables 55, which together form the duplex fiber optic cable 50. Simultaneously, waveguide filter feed-through 100 maintains a high frequency attenuation characteristic to substantially prevent radiation of predetermined frequencies of electromagnetic radiation from passing therethrough.

Waveguide filter feed-through 100 is formed by a housing 110 through which a plurality of longitudinally extended bores 130 and 140 are formed therethrough.

One of the bores 140 is centrally located within housing 110 and overlaps each of the remaining plurality of bores 130 which form waveguide passages. Waveguide passages 130 are located radially at out the central passage 140. Each of the individual waveguide passages 130 and central passage 140 have a common longitudinal access opening extending the length of housing 110. Central passage 140 has a diameter considerably larger than the diameter of waveguide passage 130 to facilitate the unique function of waveguide filter feed-through 100, as will be described in following paragraphs.

A closure for central passage 140 and each of the longitudinal access openings between central passage 140 and the waveguide passages 130 is provided by a plug 120 insertable within central passage 140. Plug 120 is releasably coupled to housing 110, forming a closure for the longitudinal access opening of each waveguide passage 130, and thereby forming one wall of each waveguide 130.

To facilitate the reversible coupling of plug 120 to housing 110 central passage 140 is tapered to form a conical bore. Thus, the diameter of central passage 140 at housing first end 112 is larger than the diameter of central bore 140 at housing second end 114. Plug 120 has a portion 122 similarly tapered to mate with the conical passage 140 of housing 110. Tapered portion 122 of plug 120 has a diameter which decreases linearly from first end 121 to second end 123, permitting plug 122 to be inserted within central passage 140, but preventing it from passing completely through the passage.

Since plug 120 forms a portion of the outer wall for each of waveguide passages 130, forming a closure for the longitudinal waveguide access opening, a tight close tolerance fit is required to achieve high frequency attenuation for the waveguide filter feed-through 100. Thus, a means for fastening plug 120 within housing 110 is provided to insure a substantially contiguous contact between tapered portion 122 of plug 120 and the tapered central passage 140 of housing 110. Although not important to the inventive concept, a tension type fastening system has been utilized in one working embodiment of waveguide filter feed-through 100, as will be described in following paragraphs. Obviously, other methods of fastening plug 120 within central passage 140 of housing 110 could be utilized without departing from the scope of the inventive concept.

Plug 120 includes a threaded portion or lug 124 extending from second end 123 of tapered portion 122. With plug 120 inserted within central passage 140, threaded portion 124 extends from central passage 140 beyond second housing end 114. Using a threaded fastening system comprising lock washer 125, flat washer 126 and nut 128, where at least washers 125 and 126, and optionally nut 128, have diameters greater than the diameter of central passage 140 at housing second end 114. Plug 120 can then be pulled tightly into contiguous contact with central passage 140 by tightening nut 128 on threaded lug 124 of plug 120.

Figure 1:
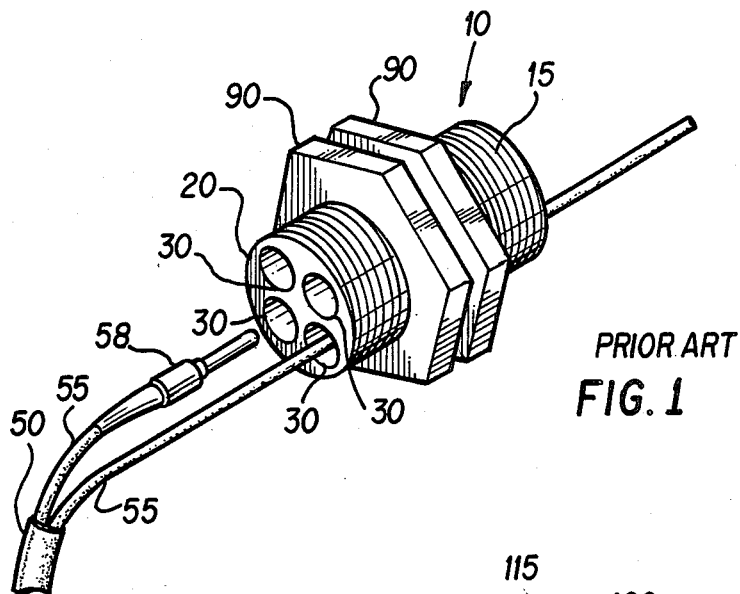
FIG. 1 is a perspective view of a prior art system.

During use, plug 120 is removed from central passage 140, formed in housing 110, to allow previously terminated cables to be inserted therethrough. The diameter of central passage 140 is sufficiently large to allow the optical cable termination connector 58 (shown in FIG. 1) to easily pass therethrough. Subsequent to passage of each of the pair of termination connectors 58 and their corresponding individual fiber optic cables 55 through central passage 140, the duplex fiber optic cable 50, comprising the pair of fiber optic cables 55, may be passed into an unoccupied waveguide passage 130 through the longitudinal access opening which is formed between central passage 140 and the selected waveguide passages 130. This procedure may be repeated until all of the waveguide passages 130 contain a cable.

However, it is not necessary to maintain a cable within each of the waveguide passages 130 for proper functioning of the waveguide filter feed-through 100. Each of the individual waveguide filters formed by the waveguide filter passages 130 maintain the desired filter characteristics regardless of whether a fiber optic cable 50 is inserted therein. Obviously, housing 110 can be constructed so as to have only a single waveguide passage 130 formed therein.

After the desired number of duplex fiber optic cables 50 have been inserted within respective waveguide filter passages 130, plug 120 is inserted into the central conically shaped passage 140, sealing passage 140 and each of the longitudinal access openings for each of the waveguide filter passages 130. The threaded lug 124 extending from the conical portion 122 of plug 120 extends through central passage 140 past second end 114 of housing 110, and is engaged by the threaded fastener 128 and washers 125 and 126. Fastener 128 tightly secures plug 120 within the central passage 140 of housing 110, providing the high performance waveguide filter feed-through 100 for passage of at least one previously terminated duplex fiber optic cable 50.

As shown in FIG. 2, housing 110 is a longitudinally extended cylindrically shaped member having threads 115 formed in the outer wall of housing 110. Threads 115 are used to couple waveguide filter feed-through housing 110 to the portion of the shielded enclosure, or bulkhead, through which the cables 50 must pass. The aperture formed in the shielded enclosure, through which waveguide filter feed-through 100 is inserted, may have an internal thread to matingly engage with thread 115, or in the alternative, a pair of internally threaded fasteners 90, shown in FIG. 1, may be used to secure waveguide filter feed-through 100 to the shielded enclosure wall therebetween. Other methods of securing the waveguide filter feed-through 100 to the wall of a shielded enclosure may also be utilized, such as the addition of attachment flanges, or coupling the housing 110 to the enclosure wall by welding, brazing, soldering, or by electrically conductive adhesive means.

As previously described, housing 110 is provided with a large central passage 140 formed in housing 110 and extending its entire length. Central passage 140 overlaps a second passage 130, similarly extending through the length of housing 110. The number of passages 130, located radially about central passage 140 can vary from one to any number, limited only by their diameter and the diameter of the cylindrical housing 110. In one working embodiment, a housing 110 having an approximating length of 1.687 inches, with six waveguide passages 130 having an approximate diameter of 0.257 inches, surrounding a central passage 140 whose minimum diameter is approximately 0.500 inches has been used successfully.

The large diameter passage 140 formed in housing 110 permits fiber optic cables 55, previously terminated with connectors 58 (shown in FIG. 1) to be inserted therethrough without requiring an extended length of duplex fiber optic cable 50 to be stripped back to expose the separate fiber optic cables 55, as required by prior art devices. Additionally, the small diameter of waveguide passages 30 formed when plug 120 is inserted and secured within central passage 140 provides a waveguide filter having a superior high frequency attenuation characteristic, as compared to that of the prior art. In one working embodiment, an attenuation of 100 db is achieved for a frequency of 22.08 G Hz, whereas the prior art device shown in FIG. 1 achieves only an attenuation of 100 db for a frequency of 15.44 G Hz. Once plug 120 is installed within central bore 140, the only openings through which electromagnetic energy radiation may pass are the waveguide passages 130, whose diameter and length have been predetermined to provide the required attenuation for the intended application.

For passages 130 to function as a waveguide, housing 110 and plug 120 must be formed from an electrically conductive material with housing 110 being electrically coupled to the ground plane of the shielded enclosure through which it passes. Electrical coupling between housing 110 and plug 120 is provided by the contiguous contact between the tapered portion 120 and the internal surface of the conical bore 140, as well as the contact made between the fastener 128, washers 125 and 126, and the lug 124 of plug 120.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended claims.

What is claimed is:

1. A waveguide filter for functioning as a cable feed-through of previously terminated cables, said waveguide filter having predetermined dimensions for attenuating electromagnetic radiation of predetermined bandwidth, comprising:
   (a) a longitudinally extended housing having at least two overlapping longitudinally directed bores extending therethrough, a first of said bores forming said waveguide filter and having a common longitudinal access opening with a second of said two bores;
   (b) a plug member insertable within said second bore for forming a closure for said waveguide access opening; and,
   (c) fastening means for releasably coupling said plug member to said housing.

2. The waveguide filter as recited in claim 1 wherein said second bore formed in said housing is tapered at a predetermined angle to form a conical bore.

3. The waveguide filter as recited in claim 2 wherein said plug member has a frusto-conical contoured portion tapering from a first end to a second end at a predetermined angle to interfittingly mate with said conical bore of said housing.

4. The waveguide filter as recited in claim 1 wherein said housing includes a longitudinally extending cylindrical contour defining an outer housing wall for insert through an opening in a bulkhead of a shielded enclosure.

5. The waveguide filter as recited in claim 4 wherein said outer housing wall is adapted for coupling said housing to said bulkhead.

6. The waveguide filter as recited in claim 5 wherein said outer housing wall includes thread members for threadedly coupling said housing to said bulkhead.

7. The waveguide filter as recited in claim 3 wherein said plug member has a threaded portion extending from said second end of said frusto-conical portion of said plug member; said threaded portion extending external said housing when said plug member is inserted in said second bore.

8. The waveguide filter as recited in claim 7 wherein said fastening means includes a fastener having a diameter greater than a diameter of said second bore for threadedly coupling to said threaded portion of said plug member.

9. The waveguide filter as recited in claim 1 wherein said second bore formed in said housing has a predetermined diameter greater than a diameter of said cable terminations for passage of said terminated cable therethrough.

10. The waveguide filter as recited in claim 9 wherein at least one of said cables is insertable from said second bore into said waveguide filter through said longitudinal access opening, said waveguide filter having a diameter less than said diameter of said second bore.

11. A cable feed-through system for providing access to a shielded enclosure by previously terminated cables, comprising:
   (a) a housing of predetermined length having a plurality of bores extending axially therethrough, one of said bores being centrally located with each of said other of said plurality of bores being located radially about said central bore, each of said radially located bores forming a first portion of an individual waveguide and having a longitudinal passage extending said length of said housing and opening into said central bore for insert of said previously terminated cable, each of said individual waveguides having a diameter less than a diameter of said central bore;
   (b) plug means for forming a closure for each of said waveguide portions, said plug means being insertable within said central bore of said housing and being releasably coupled thereto and forming a second portion for each of said waveguides; and,
   (c) first fastening means for coupling said housing to said shielded enclosure.

12. The cable feed-through system as recited in claim 11 wherein said plug means includes second fastening means for releasably coupling said plug means within said central bore of said housing.

13. The cable feed-through system as recited in claim 12 wherein said plug means further includes a body member having a first portion with a tapered contour and a threaded second portion for coupling to said second fastening means, said body member being insertable into said central bore of said housing.

14. The cable feed-through system as recited in claim 13 wherein said central bore is tapered at a predetermined angle forming a conical bore for matingly engaging said tapered contour of said body member first portion.

15. The cable feed-through system as recited in claim 11 wherein said central bore diameter is greater than a diameter of said cable termination for passage of said terminated cable therethrough.

16. The cable feed-through system as recited in claim 15 wherein said cable is insertable into said first portion of one of said individual waveguides from said central bore through said longitudinal passage.

17. The cable feed-through system as recited in claim 11 wherein said housing is adapted to be insertable through an opening formed in said shielded enclosure and coupled thereto.

18. The cable feed-through system as recited in claim 17 wherein said housing is formed in a cylindrical contour.

19. The cable feed-through system as recited in claim 18 wherein said housing includes a threaded outer wall for threadedly mating with said first fastening means for releasable coupling to said shielded enclosure.

20. The cable feed-through system as recited in claim 13 wherein said housing and said body member are formed from an electrically conductive material composition.

21. An improved waveguide filter having a housing with at least one access opening on opposing ends thereof for feeding previously terminated cables through a bulkhead of a shielded enclosure, said waveguide filter openings having a predetermined diameter greater than said cable termination and said waveguide filter having a predetermined length dimension for establishing a predetermined filter characteristic, the improvement comprising:

means for inserting said previously terminated cable into said waveguide filter including a housing having a waveguide filter passage and a centrally located passage formed therethrough, said waveguide filter passage having a longitudinal access opening between said waveguide filter passage and said centrally located passage extending said length of said waveguide filter, said previously terminated cable being insertable through said centrally located passage and a portion of said cable then being insertable into said waveguide filter passage through said longitudinal access opening; and, plug means for forming a reversible closure for said waveguide filter longitudinal opening, said plug means being insertable within said housing centrally located bore and releasably coupled thereto.

* * * * *